United States Patent
Arakali et al.

(10) Patent No.: US 7,639,081 B2
(45) Date of Patent: Dec. 29, 2009

(54) BIASING SCHEME FOR LOW-VOLTAGE MOS CASCODE CURRENT MIRRORS

(75) Inventors: Abhijith Arakali, Karnataka (IN); Sunil Rafeeque, Bangalore (IN)

(73) Assignee: Texas Instuments Incorporated, Dallas, TX (US)

( * ) Notice: Subject to any disclaimer, the term of this patent is extended or adjusted under 35 U.S.C. 154(b) by 0 days.

(21) Appl. No.: 11/742,117

(22) Filed: Apr. 30, 2007

(65) Prior Publication Data

US 2008/0186101 A1 Aug. 7, 2008

(30) Foreign Application Priority Data

Feb. 6, 2007 (IN) .......................... 259/CHE/2007

(51) Int. Cl.
 *H03F 3/04* (2006.01)
(52) U.S. Cl. ...................................... 330/288; 330/296
(58) Field of Classification Search ................. 330/277, 330/285, 288, 296; 323/315, 316
 See application file for complete search history.

(56) References Cited

U.S. PATENT DOCUMENTS

| 4,477,782 | A |   | 10/1984 | Swanson |         |
|-----------|---|---|---------|---------|---------|
| 5,359,296 | A | * | 10/1994 | Brooks et al. | 330/288 |
| 6,169,456 | B1 | * | 1/2001 | Pauls | 330/288 |
| 6,617,915 | B2 |  | 9/2003 | Rajan |  |
| 6,803,808 | B2 | * | 10/2004 | Wu | 330/288 |

OTHER PUBLICATIONS

Ysividis & Antognetti, "Design of MOS VLSI Circuits for Telecommunications", p. 560 (1985 Prentice Hall).
Gray & Meyer, "Analysis and Design of Analog Integrated Circuits", Chapters 1 and 4 (1993 John Wiley & Sons).
Johns & Martin, "Analog Integrated Circuit Design", Chapter 1, (1997 John Wiley & Sons).
V. Coelho Vincence, C. Galup Montoro, and M. Cherem Schneider, "A High-Swing MOS Cascode Bias Circuit", IEEE Trans. Circuits Syst. II, vol. 47. pp. 1325-1328, Nov. 2000.
P. Helm and M. A. Jabri, "MOS cascode-mirror biasting circuit operating at any current level with minimal output saturation voltage", Electron Lett., vol. 31, pp. 690-691, Apr. 1995.

(Continued)

*Primary Examiner*—Khanh V Nguyen
(74) *Attorney, Agent, or Firm*—Ronald O. Neerings; Wade James Brady, III; Frederick J. Telecky, Jr.

(57) ABSTRACT

A circuit and a method for biasing a compound cascode current mirror (CCCM) that enables high-voltage swing at the output and accurate current mirroring is presented. The CCCM has mirror transistors and cascode transistors which may be of a different technology kind. The drain-source voltage Vds of the mirror transistor on the input leg of the CCCM is held at a voltage Vov that is generated by the biasing circuit; Vov is the overdrive voltage of the input mirror transistor of the CCCM and the value of Vov is maintained by the bias circuit and a feed-back amplifier such that the mirror transistor remains on the edge of its active region, over manufacture deviations and tracks even over operational conditions such as temperature and supply variations. The feed-back amplifier drives the gates of the cascode transistors and uses its feedback node to hold the Vds at Vov.

20 Claims, 4 Drawing Sheets

OTHER PUBLICATIONS

E. Sackinger and W. Guggenbuhl, "A high swing, high impedance MOS cascode circuit", IEEE J. Solid-State Circuits, vol. 25, pp. 289-298., Feb. 1990.

A. Garimella, L. Garimella, J. Ramirez Angulo, A. Lopez Martin, and R. Carvajal. "Low-voltage high performance compact all cascode CMOS current mirror", Electron Lett., vol. 41, pp. 1359-1360, Dec. 2005.

R. R. Torrance, T. R. Viswanathan, and J. V. Hanson, "CMOS Voltage to Current Transducers", IEEE Transactions on Circuits and Systems, vol. cas-32, No. 11, Nov. 1985.

* cited by examiner

BIASING SCHEME FOR LOW-VOLTAGE MOS CASCODE CURRENT MIRRORS

CROSS-REFERENCES TO RELATED APPLICATIONS

Not Applicable.

STATEMENT REGARDING FEDERALLY SPONSORED RESEARCH OR DEVELOPMENT

Not Applicable.

FIELD OF THE INVENTION

The present embodiments relate to semiconductor circuits such as on a chip (IC) or to circuits with discrete components such as on a printed circuit board (PCB) and are more particularly directed to a cascode current mirror circuit and a biasing scheme for the mirror circuit.

BACKGROUND OF THE INVENTION

Electronic circuits generally include current mirrors as a basic building block in order to transfer current, to provide bias current sources which may further provide bias voltage sources. Current mirrors may also exist as part of the signal path rather than the bias path, such as in current feedback amplifiers. A current mirror is a circuit which, ideally, has zero input impedance to receive an input bias current and infinite output impedance, so that current output remains a fixed function of current input (stiff), regardless of variations in output load, variations in output voltage or fluctuations in applied power source; the current mirror is said to mirror current accurately. To achieve the desired large output impedance typically requires some form of cascoding (series stacking of transistors) in order to multiply the output resistance. The need to do this becomes increasingly more important, as process minimum geometries continue to shrink and output resistances of short channel length devices continue to drop. An undesirable side effect of cascading, however, is that output voltage swing (range of output voltage for which the output resistance remains high) becomes limited due to the need to maintain additional series-connected devices in their active (e.g., saturated for MOS devices) operating regions. This problem of loss of voltage range is further compounded by a trend toward lower voltage power supplies in small geometry processes. For example, losing 1.0 V of output range can be significant, resulting in total output voltage swings of less than 1.5 V, where a 2.5 V voltage supply is involved. The problem worsens with portable electronic devices, personal medical electronics, and wireless applications where supply voltage ranges are now typically lower than 2.5 V.

First some terminology and introduction is needed. As described in the Johns & Martin reference, "Analog Integrated Circuit Design", Chapter 1, (1997 John Wiley & Sons)), a MOS transistor operates in its saturated region when its drain-source voltage Vds is at least as great as its gate (gate-source) voltage Vgs minus its threshold voltage Vt (i.e., the voltage at which the inversion layer is formed) and Vgs is greater than Vt. The minimum value of the source-drain voltage Vds that satisfies these relationships is termed the overdrive voltage Vov of the transistor, and can be expressed as follows: Vov=Vgs−Vt where Vov is the minimum Vdsat saturation voltage of the transistor. The Vgs voltage is an applied voltage that is typically a function of the circuit design and power supply voltages; it is extrinsic to the transistor. There is a well known "body effect" where the threshold voltage Vt, intrinsic to the transistor, depends on whether the bulk (backgate) terminal is at the same voltage as the source terminal of the transistor. In many kinds of MOS technologies, there is no ability to directly short together the bulk terminal and the source terminal, to conveniently set the voltage of the two terminals to be the same. The value of Vt increases when the two terminals are not at the same voltage. Therefore, in some technologies, the value of Vov and Vdsat may be dependent on the body effect, along with other conditions such as temperature, current density, etc. There is a square law relationship between a drain current Id through the transistor and its node voltages when a MOSFET is operating in the active region (Johns & Martin):

$$Id = u\,C_{ox}W(Vgs-Vt)^2(1+\lambda(Vds-(Vgs-Vt))/(2L)$$

Where Vgs is the gate-source voltage, Vds is the drain-source voltage, W is the physical gate width, L is the effective gate length, u is the mobility of electrons near the silicon surface, $C_{ox}$ is the gate oxide capacitance per unit area, and λ is an output impedance constant. The conditions for a transistor to be in the active region are Vgs>Vt and Vds>Vov, so that a current Id flows through the transistor. A graphical plot of the above equation shows Id is relatively constant with respect to Vds, in the active region condition. Constancy of Id is highly desirable for current source and current mirror circuits; so transistors being in the active region is highly desirable. For transistors of a well designed current mirror circuit operating under such conditions, the output resistance would be high and the current generated would be substantially constant.

A cascode current mirror is shown in FIG. 1a, which will be termed a compound cascode current mirror (CCCM, 10) in this disclosure. It was introduced in U.S. Pat. No. 4,477,782, (FIG. 2) and Ysividis & Antognetti "Design of MOS VLSI Circuits for Telecommunications", p. 560 (1985 Prentice Hall). In CCCM 10, transistors M1 and M2 are the mirror transistors and M3 and M4 are the cascode transistors cascoding (coupled in series with) M1 and M2, respectively. Transistors M1 and M3 form the input leg coupled to the input current bias node; M2 and M4 form the output leg coupled to the output node. In addition to the above references, general background information relating to the cascode configuration and current mirror circuits is also given in Gray & Meyer, "Analysis and Design of Analog Integrated Circuits", Chapters 1 and 4 (1993 John Wiley & Sons). Biasing schemes to enable the CCCM to operate reasonably properly are provided in the above references and also in other patents, e.g. U.S. Pat. No. 6,617,915 B2. Further example biasing schemes are shown in FIGS. 1a and 1b elements 20, 30, and 40. Generally the gates of the cascode transistors are biased at some voltage, though one example also attempts to inject a current at the connection (intermediate) node between M1 and M3 of the input leg.

FIG. 1a illustrates a CCCM 10 implemented using N-channel MOS transistors where the prior art biasing schemes have attempted to improve the output swing of the CCCM on the output leg. However, during the operation of a circuit, the environmental conditions (e.g. supply voltages, temperature, pressure) typically will vary. During the manufacture of the circuit, there will also be technology process variations, mismatches and process corner variations. These conditional variations will cause the performance of the CCCM to not mirror current accurately and vary in a way that is not solved by the prior art biasing schemes. For example, the transistors of the CCCM may not operate in the optimal active region, the range of output voltage swing will vary, and so on. The prior art bias schemes do not bias the CCCM to have the lowest saturation voltage (just entering the active region) across process corners. The prior art schemes also tend to work poorly when the cascode and mirror transistors are of different type (technology kind) transistors. Most process technologies offer a variety of transistors even if they are of the same N or P flavor, e.g. high or low Vt Nmos, thick or thin gate oxide, drain extended, high or low breakdown voltage, and so on. It is generally beneficial to use a different kind of transistor for the cascode transistors as opposed to the mirror transistors in the CCCM in order to allow for, say, more headroom within a limited supply voltage range or lowered parasitic capacitance dependent on the kind of transistor used. The prior art schemes also tend to be more optimal for transistors with long gate lengths (L) wherein the gate W/L ratio then may become low enough to where the transistor models are less reliable, a problem during the design phase of the circuit.

By way of specific background to the preceding, FIG. 1a elements 20 and 30 illustrate a schematic of a prior art biasing circuits to allow for maximum output voltage swing in a CMOS cascode current mirror. Element 20 by Vittoz generates a bias voltage VB for the gate of the cascode transistors M3 and M4 in the CCCM element 10. Vittoz uses a diode connected transistor M5 whose Vgs is shifted upwards by split transistors M6 and M7, with M5-M7 all being the same kind of transistors. Element 30 by Vincence et al. generates the bias voltage VB using a diode-connected split transistors MA5 and MB5; the effective Vgs of this pair is shifted upwards by the circuit formed by MB7, MA7 and M6; all of these transistors are all the same kind. The same current I runs down each leg of the either the Vittoz or the Vincence et al. bias circuits. These biasing schemes are for the case where M2 and its cascode transistor M4 in the CCCM circuit 10 are of the same kind and the schemes assume that M2 has high gain.

FIG. 1b illustrates another example of a cascoded current source which maximizes the output voltage swing, which is popularly shown in college textbooks, such as Gray & Meyer. The output $I_{OUT}$ of the current source is formed by transistors Q2 and its cascode Q4. The actual mirror transistors are Q1 and Q2 which need to have comparable Vgs and comparable Vds (gate-source and drain-source voltage) in order to provide good mirrored-current matching (Iout=I1). The drain of Q2 is maintained at VDsat, the edge of the active region. Diode connected Q1 and Q3 set up voltage biases at the gates when a current I1 traverses leg A. The voltage bias input to the source follower formed by Q5 and Q6, leg B. By selecting a particular ratio of transistor sizes for circuit 40, Q2 may be biased at the edge of saturation. Although the output voltage Vout has improved voltage swing, the current matching suffers because the Vds voltage of Q1 and Q2 differ.

In view of the above issues, there arises a need to address the drawbacks of the prior art, as is achieved by the preferred embodiments described below.

BRIEF SUMMARY OF THE INVENTION

The present invention provides a circuit and a method for biasing a compound cascode current mirror (CCCM) that enables high voltage swing at the output and accurate (stiff) current mirroring. The mirror transistors and cascode transistors of the CCCM may be of a different technology kind. The circuits may be operated in a low-voltage supply environment, such as for low power applications, in a portable electronic device, a wireless system, or a medical device, etc. The drain-source voltage, Vds, of the mirror transistor on the input leg of the CCCM is held at a voltage Vov that is generated by the biasing circuit; Vov is the overdrive voltage of the input mirror transistor of the CCCM and the value of Vov is maintained such that the mirror transistor remains on the edge of its saturation (active) region, over manufacture deviations and tracking even over operational conditions such as temperature and supply variations.

The CCCM has an input leg and an output leg, and each leg has a mirror transistor connected in series with its cascode transistor with a connection node between the mirror transistor and cascode transistor; the connection node is the drain of the mirror transistor. The input leg and output leg drain terminals of the cascode transistors are connected to the input node and output node, respectively. An input node of the CCCM is further connected to the gate terminals of the mirror transistors; and the connection node of the input leg is maintained at an overdrive voltage Vov of the mirror transistor of the input leg. There is a feedback loop with an amplifier driving and outputting a control voltage at the output node of the amplifier, receiving the overdrive voltage Vov at the input node of the amplifier, and reproducing the overdrive voltage at the feedback node of the amplifier; and the output node is connected to the gate terminals of the cascode transistors and the feedback node is connected to the connection node of the input leg of the CCCM. The gate terminals of the cascode transistors of the input and output legs are driven at the control voltage; and the control voltage and the overdrive voltage Vov are both maintained by the feedback loop.

A bias circuit generates the overdrive voltage Vov; the bias circuit comprises an output section and an input section which mirrors current to the output section which is coupled to the bias circuit output node to output Vov; the input section receives the two DC voltage inputs generated by DC voltage ladders. The difference between the two DC voltages is Vov. A technique generally called the inverse function approach is used to design the bias circuit, although applied herein to provide only a single-ended output voltage. The input section has an input differential transistor pair to receive the difference, Vov voltage. The output section also has a "differential" transistor pair section that mimics and tracks the pair in the input section to also have a difference, Vov voltage at the gates of the transistor pair of the output section.

A method describing the steps and function of the biasing, amplifier and CCCM circuits is provided in the disclosure. The particular Vds drain-source voltage, Vov, generated by the biasing circuit is passed to the CCCM circuit and is maintained to be the overdrive voltage of the mirroring transistor in the CCCM circuit.

Component matching is important for the CCCM and its bias circuit; therefore, the element placement (layout) for manufacture on the die is important. By the way of an example, this disclosure describes a portion of a preferred embodiment for the component placement on the die for the bias circuit having an input stage with differential pair input transistors and a first and second DC voltage ladder coupled to the differential pair inputs. The bias circuit has an output stage with differential load pair transistors which are placed to be matched and tracked with the differential pair input transistors of the input stage. The four transistors form a quartet wherein corresponding differential pair transistors are placed adjacent to each other in a first and second horizontal row, the two rows being vertically aligned. For improved tracking over operational conditions, certain transistors are selected to be of the same technology kind. The pair of biasing DC ladder legs, which generates two DC voltages, are placed vertically adjacent to each other, and they placed horizontally adjacent to their corresponding differential input transistors of the input stage.

DETAILED DESCRIPTION OF THE INVENTION

Figure 1A:
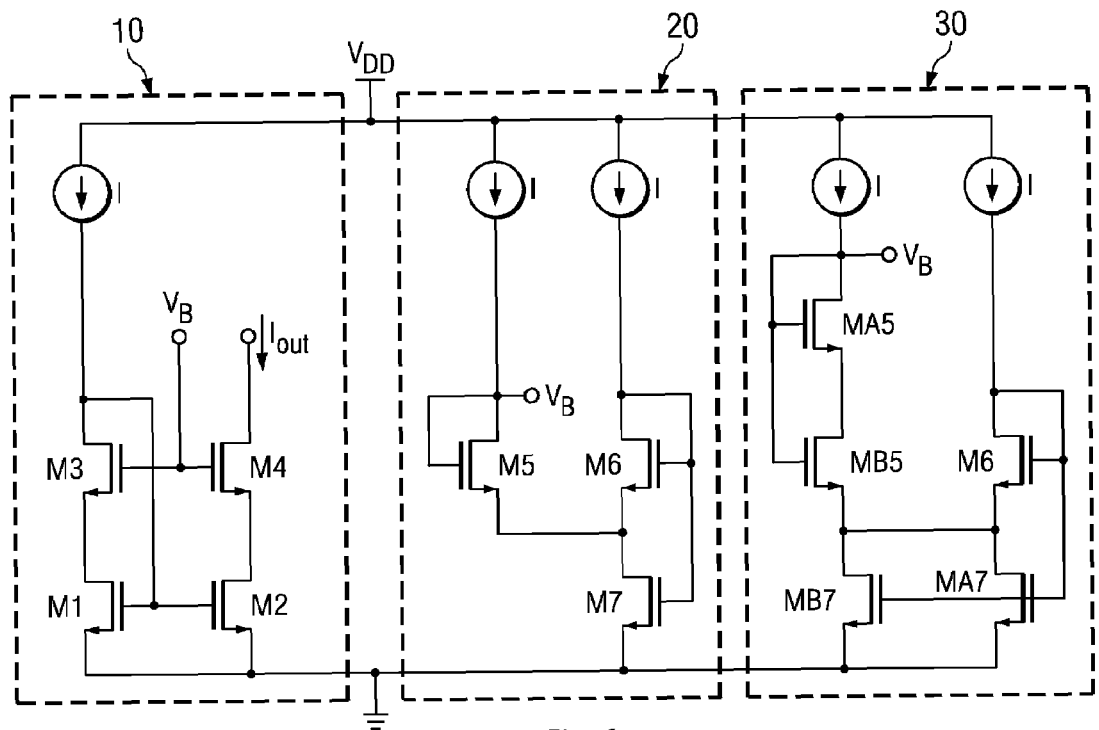
FIG. 1a illustrates a schematic of a CCCM and prior art.
Figure 1B:
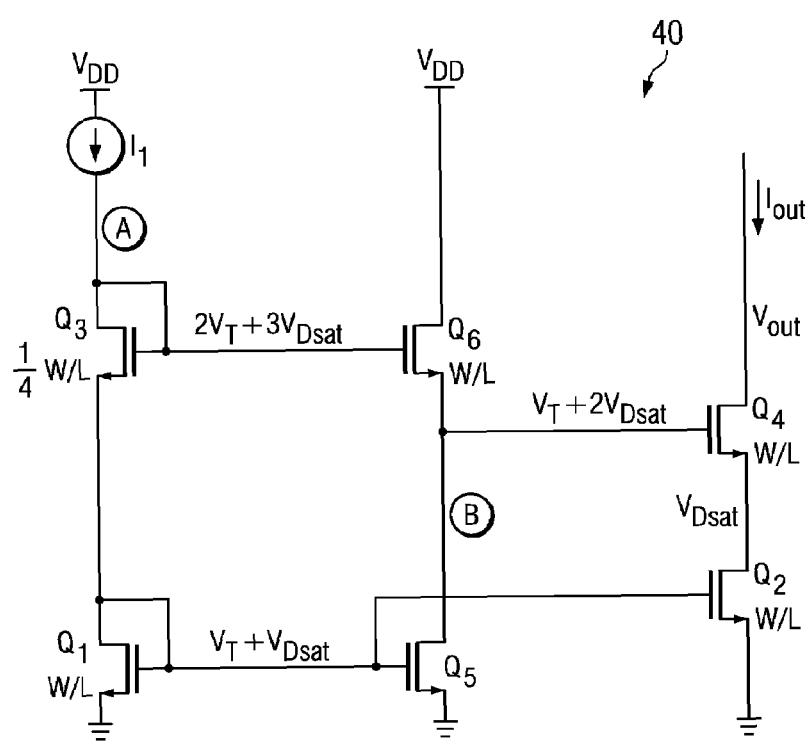
FIG. 1b illustrates prior art.

FIGS. 1a and 1b are discussed above in the Background of the Invention section of this document and the reader is assumed familiar with the principles of that discussion.

Figure 2:
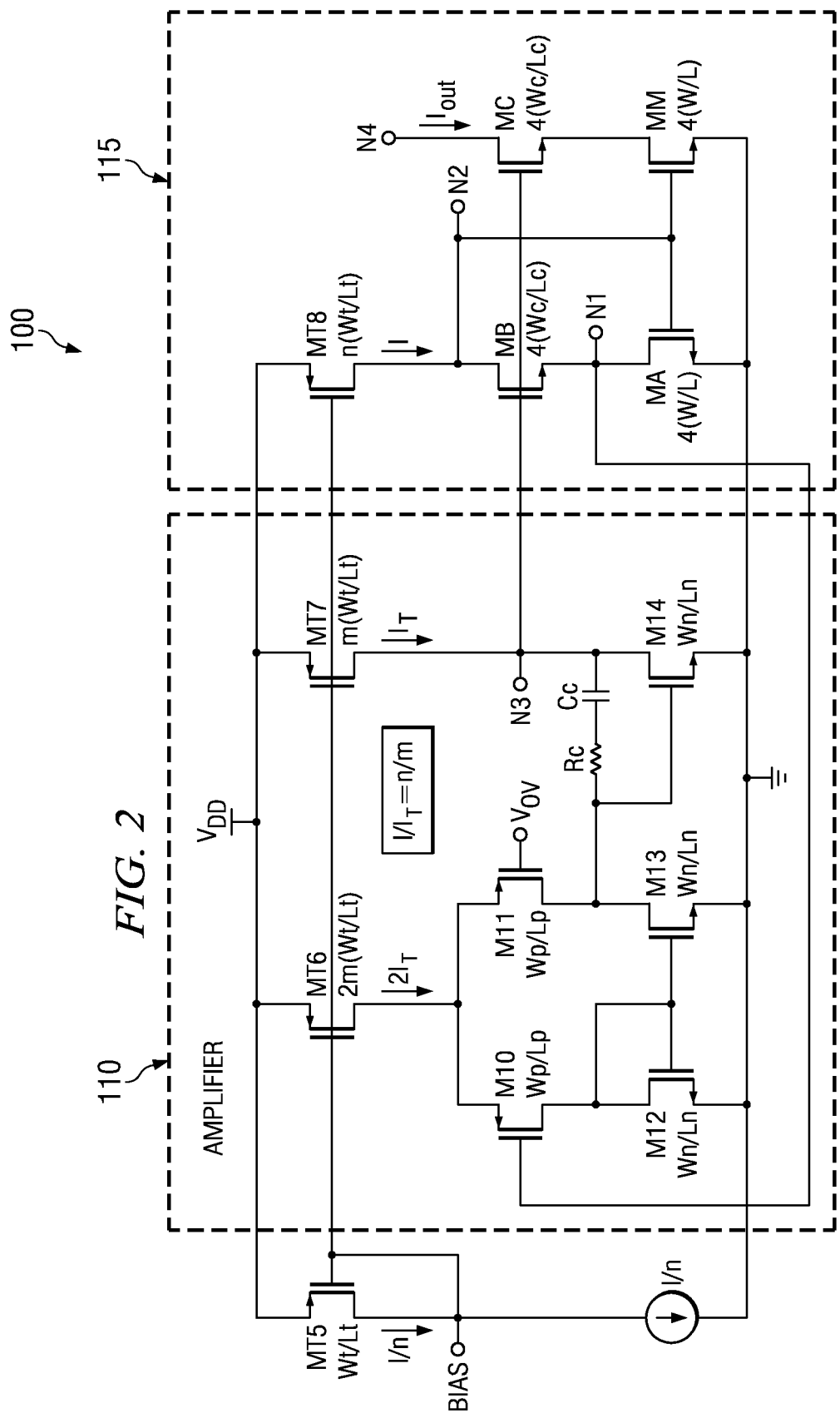
FIG. 2 illustrates a CCCM and amplifier circuits according to one embodiment of the invention.
Figure 3:
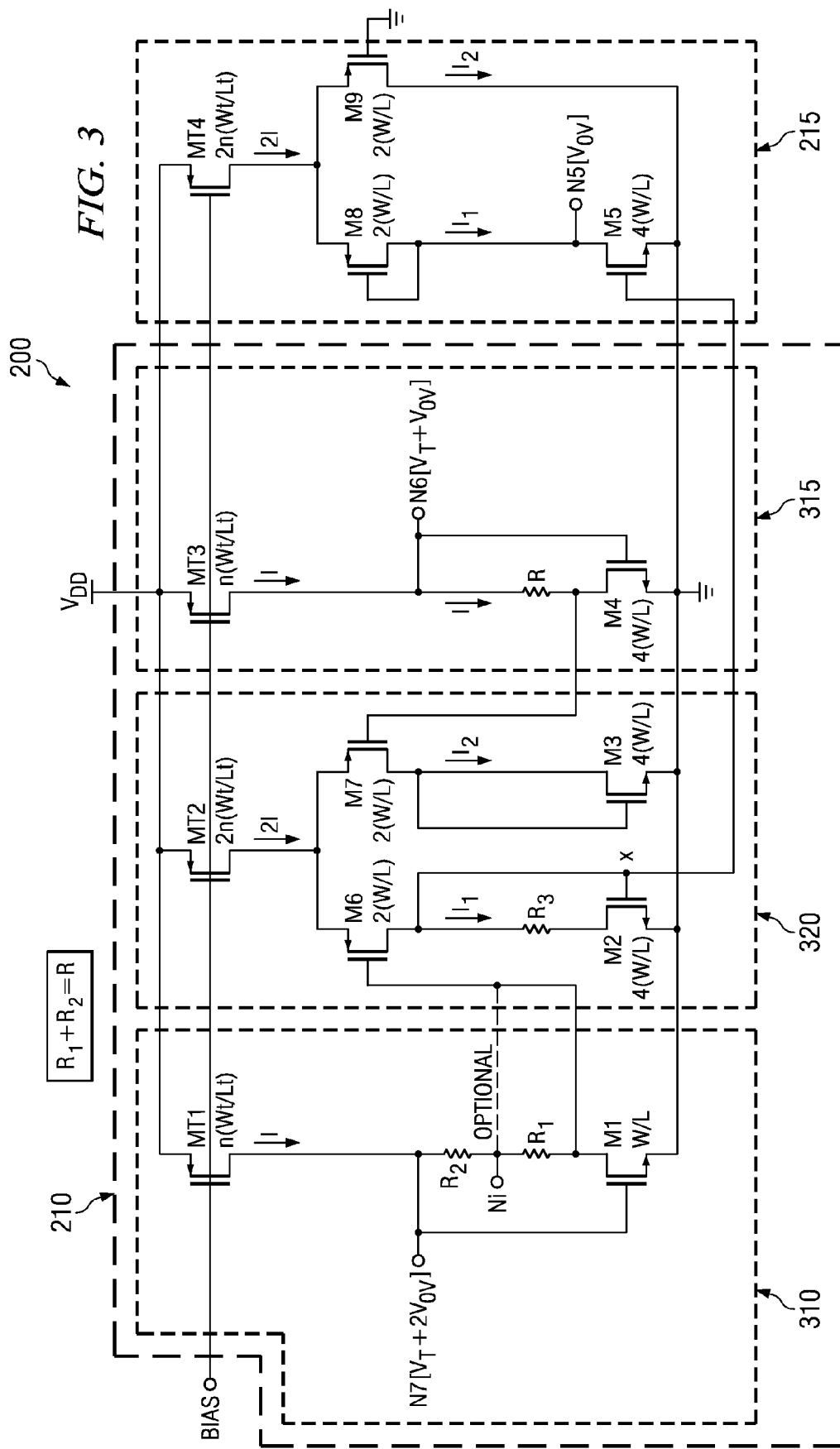
FIG. 3 illustrates a bias circuit according to one embodiment of the invention.

FIGS. 2 and 3 are circuit schematics illustrating a preferred embodiment of a CCCM, compound cascode current mirror, and its associated bias circuit. FIG. 2 dashed-box element 115 comprises a CCCM circuit and dashed-box element 110 comprises an amplifier with an input voltage labeled Vov. The Vov voltage is generated by the bias circuit 200 in FIG. 3.

In FIG. 2, an input current I for the CCCM is sourced by MT8's drain (node N2). CCCM has two current legs, an input leg comprising transistors (MA,MB) and an output leg (MM, MC). MA and MM are the two mirror transistors, which share the same Vgs voltage (gate-source voltage: gate nodes connected together at N2 and source nodes connected together at a voltage terminal such as ground). For accurate current mirroring, the Vds (drain-source voltage) of MA and MM should also be as similar as possible. There are two cascode transistors (MB,MC), where MB cascodes MA, and MC cascodes MM. The current I flows to the input node (drain of MB) of the input leg and is mirrored by the CCCM to be $I_{OUT}$ at the output node N4 (drain of MC) of the output leg. The transistors of the CCCM need to be maintained in the following way to provide a substantially constant current $I_{OUT}$, while allowing wide voltage swing at the output node N4.

To provide stiff current mirroring of the current I to $I_{OUT}$ element 115, the transistors MT8, and particularly MA, MB, MC, MM of the CCCM need to be operating in the active (saturation) region to ensure that voltage changes at the output terminal do not affect the value of output current.

Many circuit applications nowadays require very low power supply voltages in order to save power, to be operated on portable (battery) power, to reduce the amount of heat generated, and so on. Unfortunately, the voltage headroom (stacking of Vds voltage drops) becomes very low for each transistor in a stack sandwiched between the very low power supply voltage and a reference (ground) supply, a stack such as in a cascoded transistor configuration; therefore it is necessary to operate each transistor at its Vov voltage and to maintain the transistor at the edge of its saturation region, the minimum Vds condition. It is important to note, the actual value of Vov will vary with temperature, voltage supply, and Ids current. The invention provides a bias circuit for a CCCM which maintains this on-the-edge condition, allowing the CCCM circuit to be a high-voltage swing cascode current source, with substantially constant current and a wide range voltage swing at the output.

In FIG. 2, the node N1 is maintained at the Vov voltage of the transistor MA by a feedback amplifier 110. The input of the amplifier is held at Vov and the feedback node N1 of the amplifier will also be maintained substantially at Vov by the external feedback network and high gain of the amplifier, and the feedback loop of the CCCM including node N2 and transistors MA and MB. The magnitude of voltage Vov is set by a particular bias circuit scheme (FIG. 3) which has transistor elements which track transistors MA and MM (which are identical transistor technology type (kind) and also identical size if $I_{OUT}$ is to be substantially the same as I; current (de) magnification is achieved by selecting different sizes for MM vs MA). The output of the amplifier 110 is at node N3 which drives the connected gates of both cascode transistors MB and MC, maintained in the active (saturation) region. Because the cascode transistors and the mirror transistors of the CCCM are all part of the feedback loop of the feedback amplifier, the voltages are self adjusting and maintained, tracking out temperature, voltage supply and other variations. The cascode transistors are of the same kind and generally the same size.

An aspect of this invention is that the cascode transistors do not have to be of the same kind as the mirror transistors. This is useful in today's technologies where a variety of transistor kinds are offered for the same integrated circuit chip and since the cascode transistors and mirror transistors serve different purposes, it may often be more optimal to select different kinds of transistors for the two. Example transistor kinds are given in the Background section. Another aspect is once the node N1 is forced to be at Vov, the bias voltage developed at N3 will be such that when it drives the cascode transistor MC, the drain voltage of the mirror transistor MM will be close to its overdrive voltage, namely Vov. MB and MC are biased are gate biased the same and enhance the output resistance and force the magnitude of Iout to be substantially the same as I; this pins down the Vds of MM. Therefore, MA and MM will have the same Vgs and substantially similar Vds. Because the cascode transistors need not be the same kind or size as the mirror transistors, the threshold voltage of the mirror transistors may be less than the overdrive voltage of the cascode transistors, then it is generally necessary to provide the feedback from N2 to the gate of the mirror transistors through a voltage level shift such as through resistors/transistors (not shown). Then the transistors of the CCCM will be maintained in the active region and $I_{OUT}$ will track I properly.

The amplifier 110 may be of any kind of amplifier and topology, though it should have certain properties such as high gain which is desirable for optimal operation for reducing undesirable voltage offsets such as between the input and feedback node. The particular amplifier shown is a two-stage amplifier with Miller compensation Cc with a zeroing resistive element Rc (or ON transistor) in series. The first stage of the amplifier is a differential pair, M10, M11 with self biased loads M12 and M13; current to the pair is sourced by MT6. The second stage of the amplifier is the common source amplifier M14 with MT7 as its current path load. Diode connected MT5 (gate labeled BIAS) sets up the gate voltages of MT6, MT7 and MT8 (of the CCCM) to mirror bias current I/n to the two stages and to the input of the CCCM.

The bias circuit 200 of FIG. 3 generates the voltage Vov at node N5; it comprises a generator circuit that follows the principles of a so-called "inverse function approach" (Torrance et al. "CMOS Voltage to Current Transducers", Circuits and Systems Vol 32, No. 11, 1985), which converts a differential input voltage (at the gates of M6 and M7) into a pair of single-ended balanced outputs. As used in this invention, only one of the pair of balanced outputs is needed because only one voltage, Vov, is used in the subsequent circuit of FIG. 2. Therefore, there is only one output section circuits like 215 instead of two of them. The input section, dashed-box element 210, of the generator circuit mirrors current to the output section, dashed-box element 215, which is connected to the output node N5, at the drain of M5. Input section 210 is a differential pair circuit with input voltages created by the dashed-box elements 310 and 315. Output section 215 is one of the pair of balance outputs circuits where the input voltages to 210 is "reconstructed" in 215 by the differential load pair transistors M8 and M9.

As shown in FIG. 3, the input section 210 has two DC circuits 310 and 315 to set up a voltage difference of Vov at the input of the differential pair (M6, M7). Elements 310, 315 and the differential pair are sandwiched between the power supply VDD and a reference supply (e.g. ground). Element 310 and 315 are DC "voltage" ladders formed by diode connected transistors M1 and M4, respectively, both biased by a current I going through each of the ladders. These ladders self-bias the circuit 200 and allows this circuit and the CCCM to track each other if certain transistors are kept the same technology kind. Ladder 310 has a current source element MT1 whose drain is in series with the "diode-connected" M1. Series resistors R2 and R1 are inserted between what normally would have been the drain connection of M1 and the gate (node N7) of M1, so that M1 is no longer connected in the typical diode fashion (gate-drain shorted) but now has a voltage drop between the drain and the gate of M1. Similarly, ladder 315 has a current source element MT3 whose drain is in series with the "diode-connected" M4. The drain of MT3 is connected to the gate (node N6) of M4 and what normally would have been the drain of M4, so that now instead a resistor R is in between the drain of MT3 and the drain of M4. Being essentially diode connected objects, M1 and M4 operate in the active region and overdrive voltages are generated at the drains M1 and M4 of (Vt+2Vov −IR) and (Vt+Vov−IR), so that that difference in voltage is just Vov. To generate a difference voltage of Vov, M1 and M4 need to be the same kind of transistors with a size difference of 4, and the currents I need to be the same and the sum of the resistor value R1+R2=R. The drain of M1 is connected to the gate input of the differential pair transistor M6, and similarly M4 is connected to M7.

In FIG. 3, the differential pair element located at the center of 210 has a current source element MT2 sourcing current 2I (twice the value in the voltage ladders), the same differential input transistors M6 and M7, and diode-connected load elements M2 and M3, series loading M6 and M7, respectively. A current I1 and I2 runs down the legs of the differential pair into diode-connected transistors M2 and M3, respectively. Diode-connected transistor M2 is gate connected with M5 of the output section 215. Both are the same kind and size transistors, shares the same Vgs, and forms a current mirror pair with transistor M5 in the output stage so that current I1 is mirrored to the output stage. A resistor R3 is inserted between the gate and drain of M2 which otherwise is directly diode connected (drain and gate are connected together). Some resistance, R3, restricts the drain source voltage (Vds) of M2 to be more like the Vds of M5 and therefore improves the current mirroring accuracy with M5. The Vds value is the important voltage Vov that is needed by the next circuit stage (FIG. 2). For tracking purposes, the mirroring transistor MA, in the CCCM of FIG. 3 which eventually receives the Vov voltage, should be of the same transistor kind and size as the transistors M5 and M2 of FIG. 3. Alternatively, MA may be a scaled size version of M5, but with the current correspondingly scaled.

In FIG. 3, the output stage 215 has a current source transistor MT4 sourcing current 2I into differential load transistors M8 and M9 which are both diode connected (drain and gate connected), and have currents I1 and I2 flowing down the two legs, respectively, because the tail current 2I is the same as that of the differential pair element at the center of 210 and current I1 is mirrored over, leaving I2 to be the same by current conservation. M8's drain is connected in series with the drain of M5.

In FIG. 3, the generic current sources may be generated by a BIAS voltage supplied from outside, such as from FIG. 2 or from the main circuit or from some bandgap circuit for the chip. BIAS may be generated by some master current source I/n, shown on the bottom, left side of FIG. 2. In FIG. 3, BIAS sets up the same Vgs for all of the current source transistors MT1, MT2, MT3, and MT4, which should all be of the same kind, though they don't need to be of the same kind as the other transistors. For good current tracking, these current source transistors should be of the same kind as in FIG. 2, current source transistors MT5, MT6, MT7, and MT8.

In FIG. 3 elements 310 and 315, the resistors R, R1 and R2 may be included to give more overdrive margin for the differential pair formed by M6, M7. The value of these resistors is generally kept such that M1 and M4 remain in the active region over process and operating corners. The sum of R1 and R2 is equal to R. Therefore, the differential pair M6, M7 has a differential input voltage of Vov and it is generally appropriate to select their sizes such that their overdrive voltage for zero input differential voltage is at least 2Vov. M5's drain current is I1 and the current through M9 is I2. The gate of M9 is connected to ground and M6, M7, M8 and M9 are all identical kinds of transistors. Current I1 may be set up to be less than I when transistors M2 and M5 are identical to M4. It is desireable to have I1<I: then both MA (FIG. 2) and M5 (FIG. 3) will be in the desired, active region. For the same size transistors with currents I and I1, if current I allows transistor MA to have a particular Vgs−Vt value and be in the active region (Vds>Vgs−Vt), then a smaller value I1 in M5 means its Vgs−Vt value is smaller (as can be seen from the equation above with other variables being the same) than for MA; so that with a same value of Vds for both MA and M5, M5's Vds will definitely be greater than its smaller Vgs−Vt, and M5 will be deeper in the active region than MA is. The inputs to the differential pair is applied in such a way that I1<I in FIG. 3. The goal is really to have MA in the cascode be in the active region and this is an indirect way to achieve the condition. The output stage 215 reconstructs the difference voltage Vov of the differential pair element at the center of 310. Therefore the voltage at the drain of M5 will be Vov. R1 and R2 may be optionally split up and the input to M6 may be picked off at node Ni between R1 and R2 to increase the voltage input to M6 and subsequently keep M5, MA and MM deeper in saturation by increasing Vov by a voltage I×R1.

Figure 4:
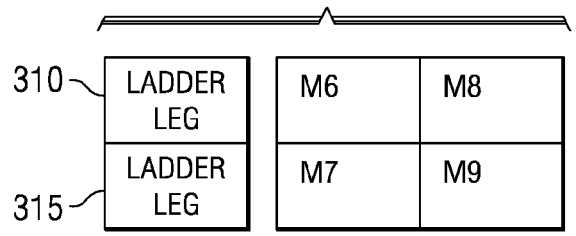
FIG. 4 illustrates a portion of the layout (circuit element placement on the die, on the reticle for manufacture) according to one embodiment of the invention.

FIG. 4 illustrates one embodiment of a portion of the layout (circuit element placement on the die) for the invention. The components of differential pairs are often placed on the die (layed out) so that the components which need to be matched are side by side; for example, the input common-source transistors such as M6 and M7 might be side by side in a horizontal row sandwiched between the bias ladder legs 310 and 315, and then below them would be the M2 and M3 pair in a second row. However instead of doing this, for better tracking with the output stage, the differential pair of the input stage 210 (FIG. 3) is placed adjacent to the output stage 215 and "corresponding" transistors M6 is next to M8 in a horizontal (reticle's x-axis) row forming a first pair, then "corresponding" transistors M7 is next to M9 in a horizontal row below the first pair. In addition, in FIG. 4, the bias ladder legs 310 and 315 are placed next to each other so as to improve their matching and tracking. Since M6 and M7 are placed vertically, they can conveniently be routed to their associated bias ladder legs 310 and 315, respectively. For better matching, dummy elements, guard rings and such can sandwich the ladder legs, and similarly sandwich the transistors M6-M9. The overall die area size occupied by the bias circuit 200 (FIG. 3) and the CCCM and the amplifier (FIG. 2, 100) is technology dependent and matching-criteria dependent. An example die area size occupied by the circuits is less than 225 um×110 um.

Figure 5:
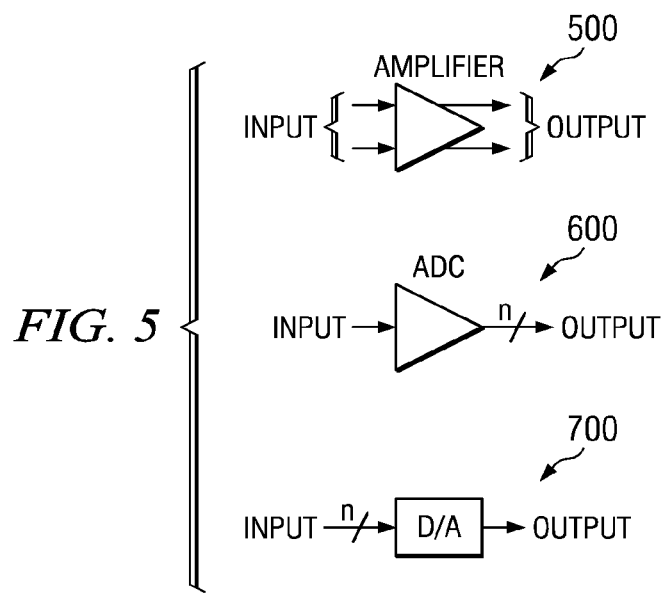
FIG. 5 illustrates example circuits which may use the invention.
Figure 6:
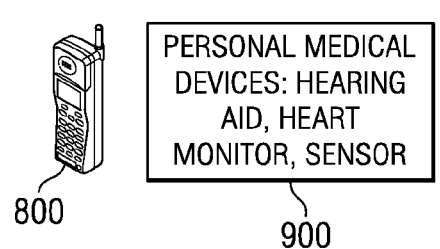
FIG. 6 illustrates example applications which may use the invention.

FIG. 5 illustrates example circuits which may use the invention. Stand-alone circuits and those integrated on a large chip typically have current sources in order to power up subcircuits, to create bias currents and voltages or to redistribute current among subcircuits in a large chip. Example circuits which require or contain current sources include amplifiers 500, and data converters like analog-to-digital 600 or digital-to-analog(DAC) 700 circuits. Current steering DACs in particular have current sources and benefit from having stiff currents along with high-voltage swings. Example applications which use the CCCM and the bias circuits of FIGS. 2 and 3 are shown in FIG. 6. Low power applications typically include battery operated wireless communication equipment such as cell phones 800 and PDA's. Data equipment examples include laptops. Entertainment equipment includes radio, voice and song recorders, or game players etc. Medical equipment 900 particularly personal equipment, hearing aids, heart monitor and other sensors used on the body need low power supply circuits like this invention. Nowadays, hand-held security equipment and taggers (e.g. RFID) all can benefit from low-supply circuits. Alternatively, high-voltage supply applications such as power management circuits, automotive applications, and the like can have increased voltage swing by using the inventive techniques disclosed in this application. Intermediate-voltage supply applications such as for communications (e.g. basestations) or wall-power applications (e.g. computers, televisions) can utilize this invention for a similar purpose.

From the above, it may be appreciated that the preferred embodiments provide a CCCM (compound cascode current mirror) and its bias circuit as shown in FIGS. 2 and 3. While these circuits have been shown in a MOSFET technology configuration, various alternatives may be used by one skilled in the art wherein these preferred embodiments may be implemented. For example, the MOSFET technology may be replaced by a bipolar, BiCMOS, BiCOM, etc. technology. The terminals (nodes) of a MOSFET, "gate", "source" and "drain" as used herein are intended to encompass the corresponding terms "base", "emitter" and "collector" of bipolar transistors. In addition, resistors and capacitors may be replaced by their transistor equivalents, such as with ON-transistors or gate capacitors. Further, the words "connection", "connected" and "connect" may include real-life physical vias, contacts, short-length metal, short-length poly and the like to physically implement the connection of two nodes (terminals) which may thus entail small voltage drops, but does not otherwise alter the intended idealness of a connection between, say, two circuit nodes such as shown on the circuit schematics of FIGS. 2 and 3. Given the preceding, therefore, one skilled in the art should further appreciate that while the present embodiments have been described in detail, various substitutions, modifications or alterations could be made to the descriptions set forth above without departing from the inventive spirit and scope, as are defined by the following claims.

The invention claimed is:

1. A circuit, comprising:
an input node and an output node;
a compound cascode current mirror (CCCM) with an input leg and an output leg, and each leg comprises a mirror transistor connected in series with its cascode transistor with a connection node between a drain of the mirror transistor and a source of the cascode transistor;
each cascode transistor of the input leg and output leg having a drain terminal which is connected to the input node and output node, respectively; the input node is further connected to gate terminals of the mirror transistors; and
the connection node of the input leg is maintained at a voltage that is an overdrive voltage of the mirror transistor of the input leg;
the gate terminal of each cascode transistor of the input leg and output leg is driven at a control voltage;
the control voltage and the overdrive voltage are both part of a feedback loop which maintains the overdrive voltage;
wherein the feedback loop comprises an amplifier driving the control voltage at an output node of the amplifier, receives the overdrive voltage at an input node of the amplifier, and reproduces the overdrive voltage at a feedback node of the amplifier; and
the output node of the amplifier is connected to the gate terminals of the cascode transistors and the feedback node is connected to the connection node of the input leg of the CCCM.

2. The circuit of claim 1 wherein the circuit is contained in a portable, electronic low power device.

3. The circuit of claim 1 wherein the circuit is contained in a wireless system.

4. The circuit of claim 1 wherein the circuit is contained in a medical device

5. A circuit, comprising:
an input node and an output node;
a compound cascode current mirror (CCCM) with an input leg and an output leg, and each leg comprises a mirror transistor connected in series with its cascode transistor with a connection node between a drain of the mirror transistor and a source of the cascode transistor;
each cascode transistor of the input leg and output lea having a drain terminal which is connected to the input node and output node, respectively; the input node is further connected to gate terminals of the mirror transistors;
the connection node of the input leg is maintained at a voltage that is an overdrive voltage of the mirror transistor of the input leg;
a bias circuit with a bias circuit output node operable to provide the overdrive voltage;
the bias circuit comprises an output section and an input section which mirrors current to the output section which is coupled to the bias circuit output node; and
the input section operable to receive two DC voltage inputs whose difference is the overdrive voltage.

6. The circuit of claim 5 wherein the gate terminal of each cascode transistor of the input leg and output leg is driven at a control voltage; and the control voltage and the overdrive voltage are both part of a feedback loop which maintains the overdrive voltage.

7. The circuit of claim 5 further comprising a pair of DC voltage ladders operable to generate the two DC voltage inputs.

8. The circuit of claim 5 wherein the circuit is contained in a portable, electronic low power device.

9. The circuit of claim 5 wherein the circuit is contained in a wireless system.

10. The circuit of claim 5 wherein the circuit is contained in a medical device.

11. A circuit, comprising:
- an input node and an output node;
- a compound cascode current mirror (CCCM) with an input leg and an output leg, and each leg comprises a mirror transistor connected in series with its cascode transistor with a connection node between a drain of the mirror transistor and a source of the cascode transistor;
- each cascode transistor of the input leg and output leg having a drain terminal which is connected to the input node and output node, respectively; the input node is further connected to gate terminals of the mirror transistors; and
- the connection node of the input leg is maintained at a voltage that is an overdrive voltage of the mirror transistor of the input leg;
- the gate terminal of each cascode transistor of the input leg and output leg is driven at a control voltage;
- the control voltage and the overdrive voltage are both part of a feedback loop which maintains the overdrive voltage;
- a bias circuit with a bias circuit output node operable to provide the overdrive voltage;
- the bias circuit comprises an output section and an input section which mirrors current to the output section which is coupled to the bias circuit output node; and
- the input section operable to receive two DC voltage inputs whose difference is the overdrive voltage.

12. The circuit of claim 11 wherein the circuit is contained in a portable, electronic low power device.

13. The circuit of claim 11 wherein the circuit is contained in a wireless system.

14. A bias circuit for a compound cascode current mirror (CCCM), comprising;
- an amplifier with an input node, a feedback node and an output node;
- the CCCM comprising two mirror transistors and two cascode transistors cascoding the two mirror transistors, respectively;
- the input node operable to receive a first voltage that is an overdrive voltage, Vov, of the mirror transistors of the CCCM; and
- the output node operable to drive a gate of each cascode transistor of the CCCM at a second voltage, and the feedback node operable to maintain a third voltage that is also Vov.

15. The bias circuit of claim 14 further comprising a generator circuit with a generator output node; the generator circuit comprises an output section and an input section which mirrors current to the output section which is operable to provide the generator output node with the first voltage; and the input section operable to receive two voltage inputs whose difference is the overdrive voltage.

16. The bias circuit of claim 14 further comprising a generator circuit which is operable to output the first voltage; and the generator circuit having inputs operable to receive two DC voltages whose difference is the overdrive voltage.

17. The bias circuit of claim 14 further comprising a generator circuit with a single-ended output node; the generator circuit comprising an input differential transistor pair section and an output differential transistor pair section that is connected to and operable to be biased by the input differential transistor pair section which comprise two input transistors' gates biased at a first difference voltage that is the overdrive voltage; the output differential transistor pair section also comprises two input transistors' gates operable to become biased at a second difference voltage that is also the overdrive voltage; and the output differential transistor pair section operable to provide the overdrive voltage to the single-ended output node.

18. A method of operating a compound cascode current mirror (CCCM) circuit, comprising the steps of:
- supplying a bias current to an input node of an input leg of the CCCM which also has an output leg connected to an output node to source an output currently;
- maintaining a first voltage at an intermediate node between a mirror transistor and its cascode transistor on the input leg of the CCCM, the first voltage being an overdrive voltage of the mirror transistor of the input leg and the intermediate node being the drain of the mirror transistor;
- connecting the input node to gates of the mirror transistor of the input leg and of a mirror transistor of the output leg; and
- driving a second voltage at gates of cascode transistors of the input leg and the output leg of the CCCM;
- maintaining the first voltage and second voltage as part of a feedback loop; and
- using an amplifier to maintain the feedback loop and the first voltage at the overdrive voltage.

19. The method of claim 18 further comprising the steps of: generating the overdrive voltage to input to the amplifier; and using an inverse function approach to generate the overdrive voltage, whereby a differential input voltage is converted into a balanced pair of single-ended output voltages, only one of which is used as the overdrive voltage.

20. The method of claim 18 further comprising the step of: using the method in a portable, electronic low power device.

* * * * *